(12) United States Patent
Torii et al.

(10) Patent No.: US 10,651,230 B2
(45) Date of Patent: May 12, 2020

(54) METHOD OF MANUFACTURING SEMICONDUCTOR DEVICE

(71) Applicant: CANON KABUSHIKI KAISHA, Tokyo (JP)

(72) Inventors: Keita Torii, Naka-gun (JP); Takashi Usui, Ashigarakami-gun (JP); Takuji Mukai, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/001,144

(22) Filed: Jun. 6, 2018

(65) Prior Publication Data

US 2018/0366512 A1    Dec. 20, 2018

(30) Foreign Application Priority Data

Jun. 14, 2017 (JP) ................. 2017-117020

(51) Int. Cl.
| | |
|---|---|
| *H01L 27/146* | (2006.01) |
| *H01L 21/02* | (2006.01) |
| *H01L 21/311* | (2006.01) |
| *H01L 21/66* | (2006.01) |
| *H01L 21/027* | (2006.01) |
| *H01L 21/8238* | (2006.01) |

(52) U.S. Cl.
CPC .... *H01L 27/14685* (2013.01); *H01L 21/0217* (2013.01); *H01L 21/0273* (2013.01); *H01L 21/02164* (2013.01); *H01L 21/31111* (2013.01); *H01L 21/31116* (2013.01); *H01L 21/823864* (2013.01); *H01L 22/26* (2013.01); *H01L 27/1462* (2013.01); *H01L 27/14612* (2013.01); *H01L 27/14689* (2013.01); *H01L 22/12* (2013.01)

(58) Field of Classification Search
CPC ................ H01L 27/146–14893; H01L 29/665
See application file for complete search history.

(56) References Cited

U.S. PATENT DOCUMENTS 5,786,276 A * 7/1998 Brooks ............. H01L 21/31116
                                              257/E21.252
5,968,844 A * 10/1999 Keller ............... H01L 21/31116
                                                     257/324

(Continued)

FOREIGN PATENT DOCUMENTS

JP         2012-234941 A     11/2012

*Primary Examiner* — Bryan R Junge
(74) *Attorney, Agent, or Firm* — Venable LLP

(57) ABSTRACT

A method of manufacturing a semiconductor device is provided. The method comprises forming a first insulator above the substrate, forming a second insulator on the first insulator, performing a first etching process of etching the second insulator by fluorine and hydrogen contained gas to expose the first insulator while leaving a portion of the second insulator which covers a side face of the gate electrode and performing a second etching process of etching a portion of the first insulator exposed by the first etching process. The first etching process includes a first process and a second process performed after the first process. A reaction product is less deposited in the first process than in the second process and etching selectivity of the second insulator with respect to the first insulator is higher in the second process than in the first process.

15 Claims, 2 Drawing Sheets

(56) References Cited

U.S. PATENT DOCUMENTS

| | | | | |
|---|---|---|---|---|
| 6,235,213 | B1* | 5/2001 | Allen, III | H01L 21/31116 |
| | | | | 134/1.1 |
| 6,461,969 | B1* | 10/2002 | Lee | H01L 21/31116 |
| | | | | 252/79.1 |
| 6,815,787 | B1* | 11/2004 | Yaung | H01L 27/14603 |
| | | | | 257/233 |
| 6,977,184 | B1* | 12/2005 | Chou | H01J 37/3244 |
| | | | | 257/E21.252 |
| 2003/0207585 | A1* | 11/2003 | Choi | H01L 21/31116 |
| | | | | 438/723 |
| 2004/0014305 | A1* | 1/2004 | Haselden | H01L 21/31116 |
| | | | | 438/585 |
| 2004/0171261 | A1* | 9/2004 | Song | H01L 21/31116 |
| | | | | 438/691 |
| 2006/0148157 | A1* | 7/2006 | Tao | H01L 21/82386 |
| | | | | 438/199 |
| 2013/0344702 | A1* | 12/2013 | Nishizuka | H01L 21/31144 |
| | | | | 438/724 |
| 2014/0167119 | A1* | 6/2014 | Javorka | H01L 29/66598 |
| | | | | 257/288 |
| 2015/0364517 | A1* | 12/2015 | Onuki | H01L 27/14612 |
| | | | | 257/292 |

* cited by examiner

METHOD OF MANUFACTURING SEMICONDUCTOR DEVICE

BACKGROUND OF THE INVENTION

Field of the Invention

The present invention relates to a method of manufacturing a semiconductor device.

Description of the Related Art

In the manufacturing of a semiconductor device, there is known a process of forming a side wall on a side face of a gate electrode of a transistor. In Japanese Patent Laid-Open No. 2012-234941, a side wall is formed by forming, on and around a gate electrode, a stacked structure made of silicon oxide and silicon nitride and performing dry etching.

SUMMARY OF THE INVENTION

In a related art, when forming a side wall, it is difficult to reduce a residue and also reduce damage to a substrate below a stacked structure.

When etching capability is increased to reduce a residue, the selectivity of a stacked plurality of insulating films can decrease. As a result, when etching an upper-layer insulating film, a lower-layer insulating film may not function as an etching stopper, and the substrate below the stacked structure may be etched. If the substrate is etched, the characteristics of a transistor may degrade. In order to suppress the etching of the substrate, etching may be performed under high-selectivity conditions to stop etching in the lower-layer insulating film, and subsequently the substrate may be exposed under a condition in which the substrate will be resistant to etching. On the other hand, when etching is performed under high-selectivity conditions, a reaction product generated during etching may be deposited on the target etching surface, and this may cause the etching rate to vary in the substrate surface or may cause the etching to stop. That is, a residue may be generated due to the generation of the reaction product.

In consideration of these problems, the present inventors have considered a technique for stopping the etching of the lower-layer insulating film if the lower-layer insulating film is exposed, while suppressing the deposition of this reaction product, when etching the upper-layer insulating film during an etching operation of a stacked-structure insulating film.

An aspect of an embodiment of the present invention provides a technique advantageous in etching a stacked-structure insulating film and forming a side wall.

According to some embodiments, a method of manufacturing a semiconductor device, comprising: forming, above a substrate on which a gate electrode is formed, a first insulating film so as to cover the gate electrode; forming, on the first insulating film, a second insulating film containing silicon and nitrogen; performing a first etching process of etching the second insulating film by using an etching gas containing fluorine and hydrogen to expose the first insulating film while leaving a portion of the second insulating film which covers a side face of the gate electrode; and performing a second etching process of etching a portion of the first insulating film which has been exposed by the first etching process, wherein the first etching process includes a first process and a second process performed after the first process, a reaction product is less deposited in the first process than in the second process, and etching selectivity of the second insulating film with respect to the first insulating film is higher in the second process than in the first process, is provided.

According to some other embodiments, a method of manufacturing a semiconductor device, comprising: forming, above a substrate on which a gate electrode is formed, a first insulating film so as to cover the gate electrode; forming, on the first insulating film, a second insulating film containing silicon and nitrogen; performing a first etching process of etching the second insulating film by using an etching gas containing fluorine and hydrogen to expose the first insulating film while leaving a portion of the second insulating film which covers a side face of the gate electrode; performing a second etching process of etching a portion of the first insulating film which has been exposed by the first etching process, wherein the first etching process includes a first process and a second process performed after the first process, and in the first process, the number of fluorine atoms contained in the etching gas is more than 1.5 times the number of hydrogen atoms, and in the second process, the number of fluorine atoms contained in the etching gas is not more than 1.5 times the number of hydrogen atoms, is provided.

Further features of the present invention will become apparent from the following description of exemplary embodiments (with reference to the attached drawings).

DESCRIPTION OF THE EMBODIMENTS

Figure 1A:
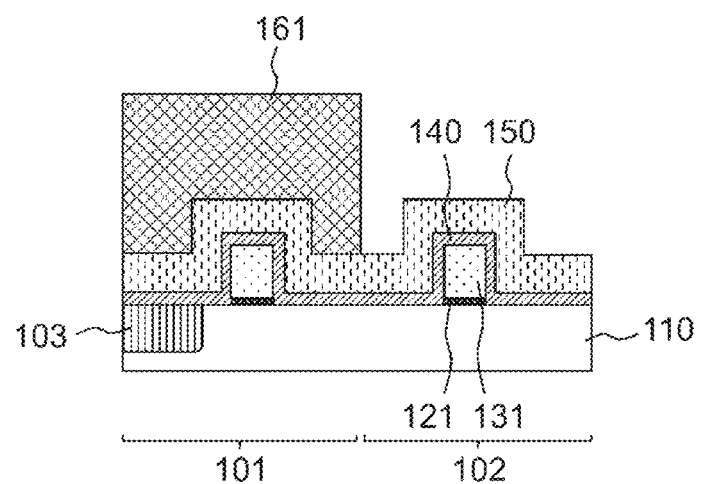
FIGS. 1A to 1D are sectional views showing a method of manufacturing a semiconductor device according to an embodiment of the present invention.

A detailed embodiment of a method of manufacturing a semiconductor device according to the present invention will now be described with reference to the accompanying drawings. Note that in the following explanation and drawings, common reference numerals denote common components throughout a plurality of drawings. For this reason, the common components will be described by cross-referencing the plurality of drawings, and a description of components denoted by common reference numerals will be appropriately omitted.

A method of manufacturing a semiconductor device according to an embodiment of present invention will be described with reference to FIGS. 1A to 1D and 2. FIGS. 1A to 1D are sectional views showing a method of manufacturing a semiconductor device 100 according to the embodiment of the present invention. In this embodiment, the semiconductor device 100 will be described as a solid-state image sensor that includes pixel regions 101 in which a plurality of pixels, each including a photoelectric converter 103, are formed and peripheral circuit regions 102 in which charges generated in the pixel region 101 are read out as electrical signals. However, the method of manufacturing the semiconductor device to be shown below can be used when manufacturing another semiconductor device such as a storage device or the like.

First, a process shown in FIG. 1A will be described. Gate insulating films 121 and gate electrodes 131 are formed on a substrate 110 according to a predetermined layout pattern. The substrate 110 may be a glass substrate or may be an electrically conductive substrate or a semiconductor substrate covered by an insulator. In this embodiment, a silicon substrate is used as the substrate 110. For example, silicon oxide, silicon oxynitride, or the like can be used as each gate insulating film 121. For example, polysilicon can be used as each gate electrode 131. However, the present invention is not limited to this, and another electrically conductive film such as a metal or oxide conductor may be used as the gate electrodes. Also, it is sufficient for each gate electrode to partially include an electrically conductive film and can include an insulating film.

Next, on the substrate 110 on which the gate electrodes 131 are formed, an insulating film 140 is formed so as to cover the gate electrodes 131. Furthermore, an insulating film 150 containing silicon and nitrogen is formed on the insulating film 140. The insulating film 140 and the insulating film 150 have a stacked structure. Although silicon oxide is used as the insulating film 140 in this embodiment, it is not limited to this. The material of the insulating film 140 may be a material which has more etching resistance than the insulating film 150 in the dry etching process (to be described later) of a second process. It is sufficient for the insulating film 150 to contain silicon and nitrogen as described above, and silicon nitride is used in this embodiment. The insulating film 150 may be a combination of two or more insulating films, and it is sufficient for one of the insulating films to contain silicon and nitrogen. In a case in which the insulating film 150 has a stacked structure by combining two or more insulating films, the insulating film on the side in contact with the insulating film 140 can contain silicon and nitrogen.

Next, a photoresist film is formed on the insulating film 150. The thickness and the material of the photoresist film can be appropriately set in accordance with the exposure wavelength used to perform exposure to form a resist pattern. The photoresist film is exposed and developed into a desired pattern by a photolithography process, and a resist pattern 161 is formed from the resist film. The resist pattern 161 covers a part of the region of the substrate 110. FIG. 1A is a sectional view showing a state after the resist pattern 161 has been formed on the insulating film 150.

After the formation of the resist pattern 161, the resist pattern 161 is set as a mask, and dry etching of the insulating film 150 is performed by using an etching gas that contains fluorine atoms and hydrogen atoms. As a result, a side wall 171 of the insulating film 150 is formed by exposing the insulating film 140 while leaving a portion which covers the side face of the gate electrode 131 in the insulating film 150 in a region not covered by the resist pattern 161. In this dry etching process, the insulating film 140 functions as an etching stopper. This dry etching process will be described in detail hereinafter.

In this embodiment, any dry etching apparatus may be used as the dry etching apparatus which is to be used for this dry etching process, and the present invention is not particularly limited by the apparatus which is to be used. An ICP etching apparatus, a magnetron RIE etching apparatus, a dual-frequency parallel-plate etching apparatus, or the like may be used as the dry etching apparatus.

The dry etching process of the insulating film 150 includes a first process and a second process performed after the first process. The dry etching process of the insulating film 150 includes, in the first process, a process of detecting the exposure of at least a part of the insulating film 140. The first process is switched to the second process in response to the detection of the exposure of at least a part of the insulating film 140. The timing to switch from the first process to the second process can be determined by detecting that the insulating film 140 has been exposed by, for example, monitoring using emission spectroscopy. In addition, for example, the timing to switch from the first process to the second process can be determined by placing a film thickness measurement apparatus in an etching chamber of the dry etching apparatus and monitoring the film thickness of the insulating film 150. In this embodiment, in both the first and second processes, fluorohydrocarbon ($CH_xF_y$) is used as the etching gas. In the dry etching process, other than $CH_xF_y$, an additional gas such as $O_2$, $N_2$, He, Ar, or the like can be used. In the first and second processes, the following reaction occurs, and etching proceeds by exhausting a reaction product from the etching chamber.

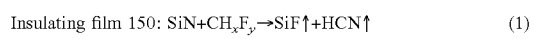
Insulating film 150: $SiN + CH_xF_y \rightarrow SiF\uparrow + HCN\uparrow$ (1)

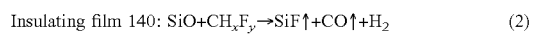
Insulating film 140: $SiO + CH_xF_y \rightarrow SiF\uparrow + CO\uparrow + H_2$ (2)

Figure 2:
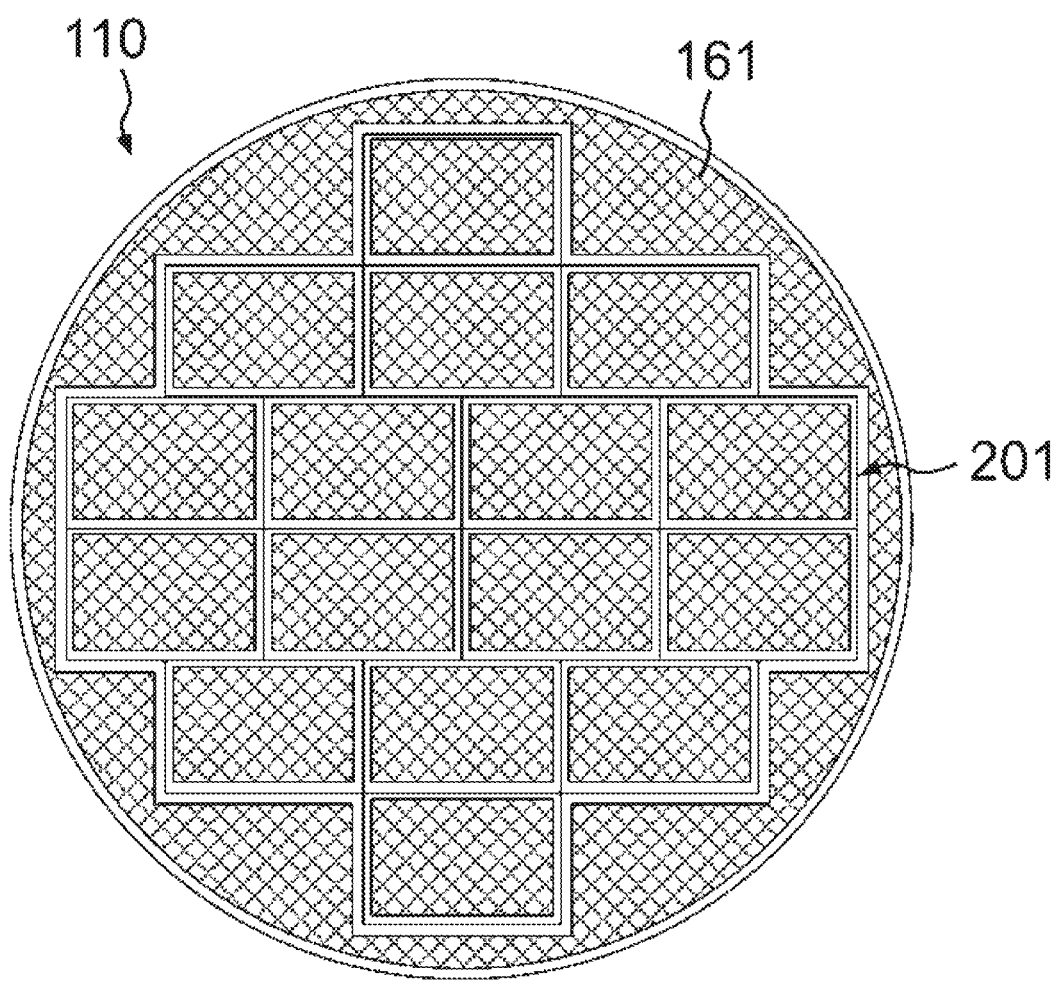
FIG. 2 is a view showing the relationship between a substrate 110 and a resist pattern according to the manufacturing method of FIGS. 1A to 1D.

When dry etching is performed, the reaction product generated during etching may be deposited on a target etching surface. If there is a large amount of reaction product deposition, it can generate a residue on the target etching surface during etching, and this may cause a variation in the etching rate or even further, stop the etching process. For example, in the manufacturing of a solid-state image sensor, a transistor is formed, in each peripheral circuit region 102, for processing each signal read out from a pixel. In recent years, the driving speed of solid-state image sensors is further increasing. Along with this, the driving speed of the transistor in the peripheral circuit region also needs to be increased. To meet this request, the technique of forming a side wall on the side face of the gate electrode 131 in each peripheral circuit region 102 needs to be advanced. On the other hand, when a side wall is to be formed in each peripheral circuit region 102, each pixel region 101 which occupies a large area of the substrate 110 is covered by the resist pattern 161, as shown in FIG. 2. In a case in which a large area of the substrate 110 is covered by the resist pattern 161, carbon atoms (C) and hydrogen atoms (H), which are the main components of the resist, are supplied from the resist pattern 161, thereby increasing the deposition ability of the reaction product and generating a residue more easily. Hence, the deposition amount of the reaction product may be small in the first process. If the substrate 110 is etched during the formation of the side wall, the characteristics of the transistor to be formed may vary. Hence, the insulating film 140 is required to function as an etching stopper when dry etching is performed on the insulating film 150. Accordingly, in the second process, the etching selectivity of the insulating film 150 with respect to the insulating film 140 may be high. The etching selectivity of the insulating film 150 with respect to the insulating film 140 is the ratio of the etching rate of the insulating film 150 to the etching rate of the insulating film 140. The selectivity is represented by (the etching rate of the insulating film 150/the etching rate of the insulating film 140).

As a result of extensive studies, the present inventors have found that the following conditions need to be satisfied in order to satisfy these requirements. An etching gas containing fluorine and hydrogen is used in the dry etching process, and the number of fluorine atoms is increased to be more than 1.5 times the number of hydrogen atoms in the first process. In the second process, the above-described requirements can be satisfied by setting the number of fluorine atoms to be 1.5 times or less than the number of hydrogen atoms. When the number of fluorine atoms is 1.5 times or less than the number of hydrogen atoms, many of the fluorine atoms are trapped by the hydrogen atoms and exhausted from the etching chamber as HF↑, and thus the generation of SiF is inhibited. At this time, as shown by chemical formula (1), etching of the insulating film 150 is facilitated because hydrogen is exhausted as HCN. On the other hand, etching of the insulating film 140 is suppressed because the hydrogen atoms caused from hydrogen ($H_2$) shown in chemical formula (2) are trapped by the fluorine atoms. As a result, high etching selectivity of the insulating film 150 with respect to the insulating film 140 is implemented. In a case in which the number of fluorine atoms is more than 1.5 times the number of hydrogen atoms, the fluorine radicals facilitating the dry etching process become dominant in the etching chamber, and the deposition ability of the reaction product is reduced. As described above, in a case in which a large area of the substrate 110 is covered by the resist pattern 161, C and H are supplied from also the resist pattern other than the target etching surface and the etching gas. Hence, in the first process, etching performance needs to be ensured by setting the number of fluorine to be more than 1.5 times the number of hydrogen atoms to reduce the deposition ability of the reaction product. Therefore, the reaction product is less deposited in the first process than in the second process, and the etching selectivity of the insulating film 150 with respect to the insulating film 140 is higher in the second process than that in the first process.

Figure 1B:
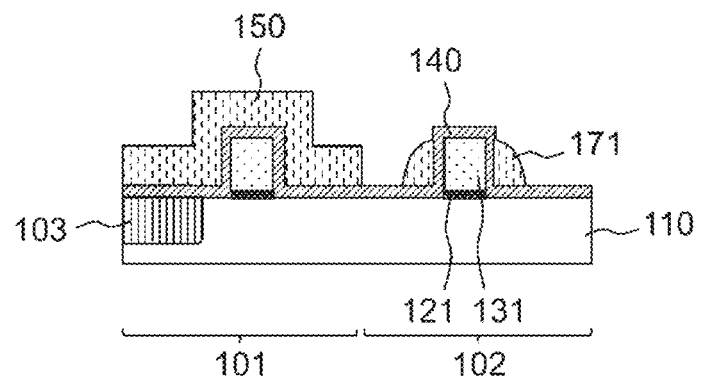

After the completion of the dry etching process which includes the first process and the second process, the resist pattern 161 is removed by ashing or using a resist stripper. FIG. 1B shows a state in which the side wall 171 of the insulating film 150 has been formed, and the resist pattern 161 has been removed.

Next, ion implantation is performed by using, as a mask, the side wall 171 of the insulating film 150 and the gate electrode 131. Subsequently, by performing an annealing process, a source/drain (diffusion layer) region (not shown) is formed on the side of the surface of the substrate 110. If an n-type MOS transistor region and a p-type MOS transistor region are arranged on the substrate 110, ion implantation can be performed on each of the regions in a state in which each region is covered appropriately by the resist pattern.

Next, wet etching is performed on a portion of the insulating film 140 which has been exposed by the dry etching process, and the surface of the substrate 110 of the portion is exposed. This process forms a side wall 170 that includes a side wall 172 of the insulating film 140 on the side face of the gate electrode 131 and the side wall 171 of the insulating film 150. In this wet etching process, the insulating film 140 on the upper portion of the gate electrode 131 is removed, and the gate electrode 131 is exposed.

Figure 1C:
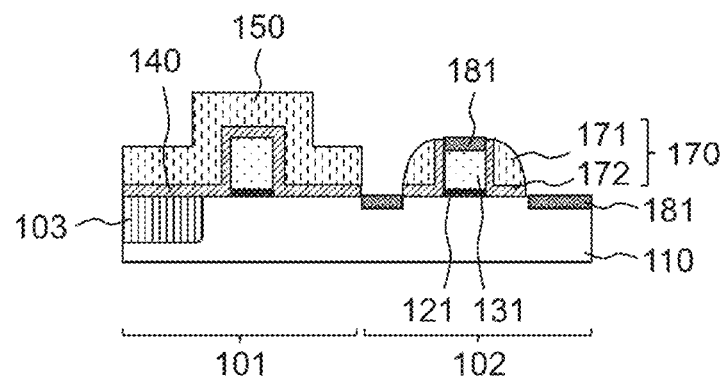

After a portion of the surface of the substrate 110 is exposed, an annealing process is performed after a metal film such as Co or Ni is deposited. This process forms silicide layers 181 containing CoSi or NiSi by silicidation the portions of the gate electrode 131 and the substrate 110 that were exposed by the wet etching process. An unreacted metal film on the insulating film 140 is removed by wet etching using, for example, sulfuric acid. FIG. 1C shows a state after the silicide layers 181 have been formed.

The above description has shown an example in which ion implantation is performed before etching the insulating film 140 by wet etching. However, the present invention is not limited to this. The side wall 170 may be formed by preforming wet etching of the insulating film 140 before ion implantation, and ion implantation may be performed by using the side wall 170 as a mask. This portion of the substrate 110 which is exposed by the wet etching process forms the source or the drain of the transistor.

Figure 1D:
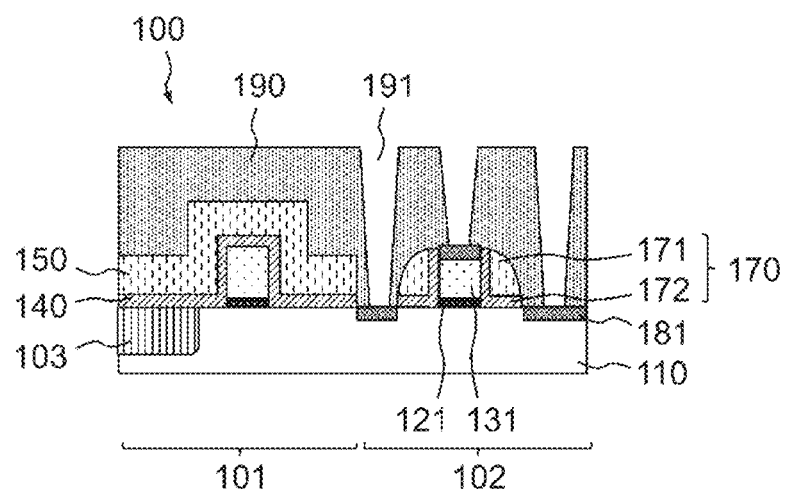

After the formation of the silicide layers 181, an insulating film 190 which is to serve as an interlayer insulating film is formed. The insulating film 190 need not be formed by one type of film and may be formed by stacking a plurality of types of films. For example, the insulating film 190 can use a stacked film containing silicon nitride and silicon oxide. After the formation of the insulating film 190, resist pattern formation and dry etching are executed to form a contact pattern 191 with the silicide layers 181. FIG. 1D shows a state after the formation of the contact pattern 191. After the formation of the contact pattern 191, formation of a wiring pattern (not shown) and formation of a color filter (not shown) are performed appropriately, and the semiconductor device 100 is completed.

Example

An example according to this embodiment will be described below by listing specific materials and processing conditions. In this example, in the process shown in FIG. 1A, a silicon substrate was used as the substrate 110, a silicon oxynitride layer having a thickness of 1 nm to 10 nm was used as each gate insulating film 121, and a polysilicon layer having a thickness of 80 nm to 350 nm was used as each gate electrode 131.

Next, a silicon oxide layer having a thickness of 5 nm to 20 nm as the insulating film 140 and a silicon nitride layer having a thickness of 10 nm to 150 nm as the insulating film 150 were sequentially stacked to cover each gate electrode 131. After the formation of the insulating film 150, a photoresist film was formed on the insulating film 150. The photoresist film was exposed and developed into a desired pattern by a photolithography process, and the resist pattern 161 was formed from the photoresist film. The thickness of the resist pattern 161 can be, for example, 200 nm to 1,500 nm, and the resist pattern covers a part of a region including each pixel region 101 of the substrate 110. A plurality of pixels, each including the photoelectric converter 103, are formed on the pixel regions 101. Note that the above-described silicide layers 181 are not formed on the transistor of each pixel region 101. In this example, as shown in FIG. 2, the resist pattern 161 covers 80% or more of the region of the substrate 110. The substrate 110 also includes a plurality of chip regions 201 each forming a single chip, and as shown in FIG. 2, the resist pattern 161 covers 80% or more of each chip region 201 of the plurality of chip regions 201.

After the formation of the resist pattern 161, the insulating film 150 was dry-etched using the resist pattern 161 as a mask, and the side wall 171 of the insulating film 150 was formed on the side face of the gate electrode 131. In this dry etching process, the following conditions can be employed as the etching conditions of the above-described first process and second process. In this example, a magnetron RIE etching apparatus which implemented a high plasma density by a magnetic field was used as the dry etching apparatus. The pressure of the process gas indicates the total pressure of gas (the etching gas and the additional gas) in the etching chamber of the plasma etching apparatus.

First Process
Pressure of process gas: 10 mTorr to 200 mTorr
Lower-portion RF power: 100 W to 2000 W
Flow rate of $CF_4$ gas: 20 sccm to 300 sccm
Flow rate of $CHF_3$ gas: 0 sccm to 200 sccm
Flow rate of $O_2$ gas: 0 sccm to 50 sccm
Flow rate of Ar gas: 0 sccm to 500 sccm Second Process
Pressure of process gas: 20 mTorr to 250 mTorr
Lower-portion RF power: 100 W to 1000 W
Flow rate of $CH_2F_2$ gas: 10 sccm to 300 sccm
Flow rate of $O_2$ gas: 0 sccm to 100 sccm
Flow rate of Ar gas: 0 sccm to 500 sccm In this example, in the first process, the number of fluorine atoms is 3.4 times or more than the number of hydrogen atoms, and in the second process, the number of fluorine atoms is equal to the number of the hydrogen atoms. That is, in the first process, the number of fluorine atoms is more than 1.5 times the number of the hydrogen atoms, and in the second process, the number of fluorine atoms is 1.5 times or less than the number of hydrogen atoms. Under the above described conditions, the reaction product was less deposited in the first process than in the second process. Also, the etching selectivity of the insulating film 150 with respect to the insulating film 140 was higher in the second process than in the first process. More specifically, the etching selectivity of the insulating film 150 with respect to the insulating film 140 in the first process was 1.5 or less. The etching selectivity of the insulating film 150 with respect to the insulating film 140 in the second process was 4 or more.

As described above, the fluorohydrocarbon included in the etching gas of the first process and the fluorohydrocarbon included in the etching gas of the second process may have different composition to each other. Also, as described above, in the first process, the etching gas may further contain a gas which contains fluorine atoms such as fluorocarbon ($C_xF_y$). For example, if fluorohydrocarbon with the same composition is to be used in the first process and the second process, the number of fluorine atoms with respect to the hydrogen atoms may be relatively increased by adding, to the etching gas in the first process, a gas containing fluorine atoms such as $C_xF_y$. In the second process, the number of hydrogen atoms with respect to the fluorine atoms may be relatively increased by introducing $H_2$ as an additional gas. After the formation of the side wall 171 of the insulating film 150, dry ashing and a cleaning process were performed, and the resist pattern 161 was removed, as shown in FIG. 1B.

After the removal of the resist pattern 161, using the side wall 171 of the insulating film 150 and the gate electrode 131 as a mask, $P^+$ and $As^+$ were implanted to the n-type MOS transistor region, and $B^+$ and $BF_2^+$ were implanted to the p-type MOS transistor region. As described above, ion implantation of these regions was performed by forming a resist pattern in each region where ion implantation was not to be performed. After ion implantation, the implanted ions were activated by performing an annealing process for 10 sec to 120 sec at 800° C. to 1,050° C.

Next, a portion of the insulating film 140 which had been exposed by the dry etching process was etched by wet etching using dilute hydrofluoric acid. By this process, the surface of the substrate 110 was exposed, and the side wall 170 was formed, on the side of the gate electrode 131, by the two layers of silicon oxide and silicon nitride formed from the insulating film 140 and the insulating film 150.

After a part of the substrate 110 was exposed by the wet etching process, a Co layer having a thickness of 4 nm to 12 nm was deposited to cover the substrate 110. After the deposition of Co, silicidation was executed by performing an annealing process at 400° C. to 900° C., and the silicide layers 181 made of CoSi were formed on the exposed surface layers of the gate electrode 131 and the substrate 110. After the formation of the silicide layers 181, unreacted Co on the insulating films 140 and 150 was removed by wet etching using a chemical solution containing sulfuric acid. FIG. 1C shows a state in which the unreacted Co has been removed.

After the formation of the silicide layers 181, the insulating film 190 was formed. The insulating film 190 had a stacked structure formed by a silicon nitride layer having a thickness of 20 nm to 80 nm and a silicon oxide layer having a thickness of 200 nm to 1,000 nm. Next, as shown in FIG. 1D, the contact pattern 191 with the silicide layers 181 was formed by dry etching using a resist pattern having a thickness of 200 nm to 800 nm and a pattern width of 70 nm to 250 nm. After the formation of the contact pattern 191, formation of a wiring pattern (not shown) and formation of a color filter (not shown) were performed appropriately, and the semiconductor device 100 was completed.

Although the embodiment and the example of the present invention have been explained above, the present invention is not limited to them, as a matter of course. The above-described embodiment can be changed or combined appropriately without departing from the spirit of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-117020, filed Jun. 14, 2017, which is hereby incorporated by reference wherein in its entirety.

What is claimed is:

1. A method of manufacturing a semiconductor device, comprising:
    forming, above a substrate on which a gate electrode is formed, a first insulating film so as to cover the gate electrode;
    forming, on the first insulating film, a second insulating film containing silicon and nitrogen;
    performing a first etching process of etching the second insulating film by using an etching gas containing fluorine and hydrogen to expose the first insulating film while leaving a portion of the second insulating film which covers a side face of the gate electrode; and
    performing a second etching process of etching a portion of the first insulating film which has been exposed by the first etching process,
    wherein the first etching process includes a first process and a second process performed after the first process,
    wherein a reaction product is less deposited in the first process than in the second process,
    wherein etching selectivity of the second insulating film with respect to the first insulating film is higher in the second process than in the first process,
    wherein in the first process, a number of fluorine atoms contained in the etching gas is more than 1.5 times a number of hydrogen atoms, and
    wherein in the second process, the number of fluorine atoms contained in the etching gas is not more than 1.5 times the number of hydrogen atoms.

2. The method according to claim 1, wherein the etching gas contains fluorohydrocarbon ($CH_xF_y$).

3. The method according to claim 2, wherein in the first process, the etching gas further contains fluorocarbon ($C_xF_y$).

4. The method according to claim 1, wherein in the second process, the etching selectivity of the second insulating film with respect to the first insulating film is not less than 4.

5. The method according to claim 1, wherein the first etching process includes, in the first process, detecting that at least a part of the first insulating film has been exposed, and switching, in response to detecting that at least a part of the first insulating film has been exposed, from the first process to the second process.

6. The method according to claim 1, wherein in the second process, the first insulating film functions as an etching stopper.

7. The method according to claim 1, wherein the first insulating film is made of silicon oxide.

8. The method according to claim 1, further comprising:
forming, before the first etching process, a resist pattern on the second insulating film,
wherein at least some of a plurality of pixels each including a photoelectric converter are formed on a portion of the substrate, which is covered by the resist pattern.

9. The method according to claim 8, wherein the resist pattern covers not less than 80% of the substrate.

10. The method according to claim 8, wherein the substrate includes a plurality of chip regions each forming a chip, and the resist pattern covers not less than 80% of each chip region of the plurality of chip regions.

11. The method according to claim 1, wherein in the second etching process, wet etching is performed on the exposed portion of the first insulating film.

12. The method according to claim 11, further comprising:
silicidation, after the second etching process, a portion of the substrate and the gate electrode exposed by the second etching process.

13. The method according to claim 11, wherein the portion of the substrate exposed by the second etching process forms one of a source and a drain of a transistor.

14. A method of manufacturing a semiconductor device, comprising:
forming, above a substrate on which a gate electrode is formed, a first insulating film so as to cover the gate electrode;
forming, on the first insulating film, a second insulating film containing silicon and nitrogen;
performing a first etching process of etching the second insulating film by using an etching gas containing fluorine and hydrogen to expose the first insulating film while leaving a portion of the second insulating film which covers a side face of the gate electrode; and
performing a second etching process of etching a portion of the first insulating film which has been exposed by the first etching process,
wherein the first etching process includes a first process and a second process performed after the first process,
wherein a reaction product is less deposited in the first process than in the second process,
wherein etching selectivity of the second insulating film with respect to the first insulating film is higher in the second process than in the first process, and
wherein the etching gas of the first process contains fluorohydrocarbon and the etching gas of the second process contains fluorohydrocarbon, and a composition of the fluorohydrocarbon contained in the etching gas of the first process is different from that of the fluorohydrocarbon contained in the etching gas of the second process.

15. A method of manufacturing a semiconductor device, comprising:
forming, above a substrate on which a gate electrode is formed, a first insulating film so as to cover the gate electrode;
forming, on the first insulating film, a second insulating film containing silicon and nitrogen;
performing a first etching process of etching the second insulating film by using an etching gas containing fluorine and hydrogen to expose the first insulating film while leaving a portion of the second insulating film which covers a side face of the gate electrode;
performing a second etching process of etching a portion of the first insulating film which has been exposed by the first etching process,
wherein the first etching process includes a first process and a second process performed after the first process,
wherein in the first process, a number of fluorine atoms contained in the etching gas is more than 1.5 times a number of hydrogen atoms,
wherein in the second process, the number of fluorine atoms contained in the etching gas is not more than 1.5 times the number of hydrogen atoms, and
wherein the etching gas of the first process contains fluorohydrocarbon and the etching gas of the second process contains fluorohydrocarbon, and a composition of the fluorohydrocarbon contained in the etching gas of the first process is different from that of the fluorohydrocarbon contained in the etching gas of the second process.

* * * * *